(12) United States Patent
Chen et al.

(10) Patent No.: US 8,587,465 B2
(45) Date of Patent: Nov. 19, 2013

(54) SUCCESSIVE APPROXIMATION ANALOG TO DIGITAL CONVERTER WITH COMPARATOR INPUT TOGGLING

(75) Inventors: Ann H. Chen, Poughquag, NY (US);
Michael S. Floyd, Cedar Park, TX (US);
Birgit Schubert, Boeblingen (DE);
Michael A. Sperling, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 100 days.

(21) Appl. No.: 13/270,983

(22) Filed: Oct. 11, 2011

(65) Prior Publication Data

US 2013/0088374 A1    Apr. 11, 2013

(51) Int. Cl.
*H03M 1/38* (2006.01)
(52) U.S. Cl.
USPC .......................................... 341/161; 341/155
(58) Field of Classification Search
USPC .................. 341/155, 144, 163, 122, 143, 141
See application file for complete search history.

(56) References Cited

U.S. PATENT DOCUMENTS

| | | | | |
|---|---|---|---|---|
| 5,404,143 | A * | 4/1995 | Distinti | 341/158 |
| 6,686,859 | B2 * | 2/2004 | Aiura et al. | 341/144 |
| 6,867,723 | B1 | 3/2005 | Tachibana et al. | |
| 7,002,501 | B2 | 2/2006 | Gulati et al. | |
| 7,015,849 | B2 * | 3/2006 | Nonaka | 341/155 |
| 7,116,260 | B2 * | 10/2006 | Luh | 341/155 |
| 7,129,882 | B2 | 10/2006 | Yukawa | |
| 7,173,558 | B2 | 2/2007 | Demirdag et al. | |
| 7,265,707 | B2 | 9/2007 | Mizukami et al. | |
| 7,265,708 | B2 | 9/2007 | Mitra et al. | |
| 7,298,306 | B2 * | 11/2007 | Melanson | 341/143 |
| 7,432,844 | B2 | 10/2008 | Mueck et al. | |
| 7,492,302 | B2 | 2/2009 | Poulton | |
| 7,741,981 | B1 | 6/2010 | Wan et al. | |

OTHER PUBLICATIONS

Kim, et al., "An Energy-Efficient Dual Sampling SAR ADC with Reduced Capacitive DAC," IEEE 2009; Department of Electrical Engineering, KAIST, Daejon, Republic of Korea; pp. 972-975.
McNeill, et al., "Split ADC Calibration for All-Digital Correction of Time-Interleaved ADC Errors," IEEE Transactions on Circuits and System—II: Express Briefs, vol. 56, No. 5, May 2009; pp. 344-348.

* cited by examiner

*Primary Examiner* — Peguy Jean Pierre
(74) *Attorney, Agent, or Firm* — Cantor Colburn LLP; William A. Kinnaman, Jr.

(57) ABSTRACT

A successive approximation analog-to-digital converter (SA-ADC) includes a reference generator configured to output a first voltage and a second voltage; a comparator, the comparator having a positive input and a negative input thereto, the comparator being configured to receive the first voltage and the second voltage; and a comparator input toggle located between the reference generator and the comparator, wherein the comparator input toggle is configured to receive the first and second voltages from the reference generator and provide the first and second voltages to the comparator, wherein the comparator input toggle is further configured to switch between a first position, in which the first voltage is connected to the positive input, and the second voltage is connected to the negative input, and a second position, in which the second voltage is connected to the positive input, and the first voltage is connected to the negative input.

18 Claims, 4 Drawing Sheets

SUCCESSIVE APPROXIMATION ANALOG TO DIGITAL CONVERTER WITH COMPARATOR INPUT TOGGLING

BACKGROUND

This disclosure relates generally to the field of computer hardware, and more particularly to successive approximation analog to digital converters.

Analog-to-digital converters (ADCs) are circuits that convert a signal in analog format to a signal in digital format. Successive approximation ADCs (SA-ADC) may be used for relatively low-speed applications. SA-ADCs have high accuracy, a small footprint, and relatively low power consumption. An SA-ADC functions by comparing the analog signal that is being converted ($V_{in}$) to a guessed analog voltage ($V_{guess}$) that is generated by a digital to analog converter (DAC) in the SA-ADC based on a digital code. Through successive passes, $V_{guess}$ gets closer to Vin, and at the final pass the digital code that creates $V_{guess}$ is given as a result that is a digital approximation of $V_{in}$.

An example of an SA-ADC according to the prior art is shown in FIG. 1. Reference generator 101 includes a digital to analog converter (DAC) 102. The reference generator provides $V_{in}$ 108 to the comparator 103. The DAC 102 in reference generator 101 generates $V_{guess}$ 107 based on input from logic 104. Logic 104 starts with all bits in a result set (which is a set of N bits) set to zero. First, the logic 104 sets the most significant bit in the result set (bit N) to 1, and sends the result set to the DAC 102 via digital inputs 106. The DAC 102 generates $V_{guess}$ 107 based on the digital input 106, and provides $V_{guess}$ 107 to the comparator 103. The comparator 103 indicates to the logic 104 whether $V_{guess}$ 107 is greater than or less than $V_{in}$ 108 via signal 109. If $V_{guess}$ 107 is determined to be greater than $V_{in}$ 108 by the comparator 103, the most significant bit in the result set is set back to zero by logic 104; otherwise, the most significant bit is left as one. The logic 104 then steps through each bit in the result set as described above, from bit N−1 to the least significant bit. At each clock cycle of clock 105, the logic 104 determines one more bit of the result set based on feedback from signal 109 from the comparator 103, and after N clock cycles, the final result set is sent to the output 110 by the logic 104.

An SA-ADC may have errors in the output due to comparator offset, DAC error, and/or reference voltage error. Some solutions to comparator offset include addition of offset correction circuitry or differential signaling to the SA-ADC. However, offset correction circuitry requires additional power for the SA-ADC circuit and a larger footprint, while differential signaling requires more complex circuitry and access to differential reference voltages, which may not be easily obtained on-chip. Additionally, offset correction or differential signaling circuitry may require a negative power supply, which may be absent in processor chips.

BRIEF SUMMARY

In one aspect, a successive approximation analog-to-digital converter (SA-ADC) includes a reference generator configured to output a first voltage and a second voltage; a comparator, the comparator having a positive input and a negative input thereto, the comparator being configured to receive the first voltage and the second voltage; and a comparator input toggle located between the reference generator and the comparator, wherein the comparator input toggle is configured to receive the first and second voltages from the reference generator and provide the first and second voltages to the comparator, wherein the comparator input toggle is further configured to switch between a first position, in which the first voltage is connected to the positive input of the comparator, and the second voltage is connected to the negative input of the comparator, and a second position, in which the second voltage is connected to the positive input of the comparator, and the first voltage is connected to the negative input of the comparator.

In another aspect, a method of operating a successive approximation analog-to-digital converter (SA-ADC), the SA-ADC comprising a reference generator configured to output a first voltage and a second voltage, a comparator, the comparator comprising a positive input and a negative input, the comparator being configured to receive the first voltage and the second voltage, and a comparator input toggle, wherein the comparator input toggle is configured to receive the first and second voltages from the reference generator and provide the first and second voltages to the comparator, includes determining a first result corresponding to a first position of the comparator input toggle, in which the first voltage is connected to the positive input of the comparator, and the second voltage is connected to the negative input of the comparator; determining a second result corresponding to a second position of the comparator input toggle, in which the second voltage is connected to the positive input of the comparator, and the first voltage is connected to the negative input of the comparator; and averaging the first result and the second result and outputting the average as a final result of the SA-ADC.

Additional features are realized through the techniques of the present exemplary embodiment. Other embodiments are described in detail herein and are considered a part of what is claimed. For a better understanding of the features of the exemplary embodiment, refer to the description and to the drawings.

BRIEF DESCRIPTION OF THE SEVERAL VIEWS OF THE DRAWINGS

Referring now to the drawings wherein like elements are numbered alike in the several FIGURES.

DETAILED DESCRIPTION

Embodiments of an SA-ADC with comparator input toggling are provided, with exemplary embodiments being discussed below in detail. Comparator offset in the SA-ADC may be removed by toggling the inputs to the comparator, determining successive results corresponding to the different toggle positions, and averaging the successive results. Because toggling the comparator inputs causes the comparator offset to switch from positive to negative (or vice versa), the comparator offset will cancel out over the averaged successive results. A more accurate digital approximation of an analog signal may be thereby obtained. The SA-ADC circuit with comparator input toggling may have a relatively small footprint and power consumption. An SA-ADC with comparator input toggling may be used for any appropriate application that benefits from relatively high accuracy, such as digitizing the output of analog sensors, for example, thermal sensors or near-DC voltage sensors in a computing system. For additional SA-ADC accuracy, one or more signal pairs inside the reference generator may also be toggled in some embodiments to compensate for DAC error and/or reference voltage generation error. Embodiments of an SA-ADC with comparator input toggling and reference voltage generation toggling, where each result is obtained with an operational amplifier in the reference generator in a different state, may be used instead of chopper-stabilized reference generation.

Figure 1:
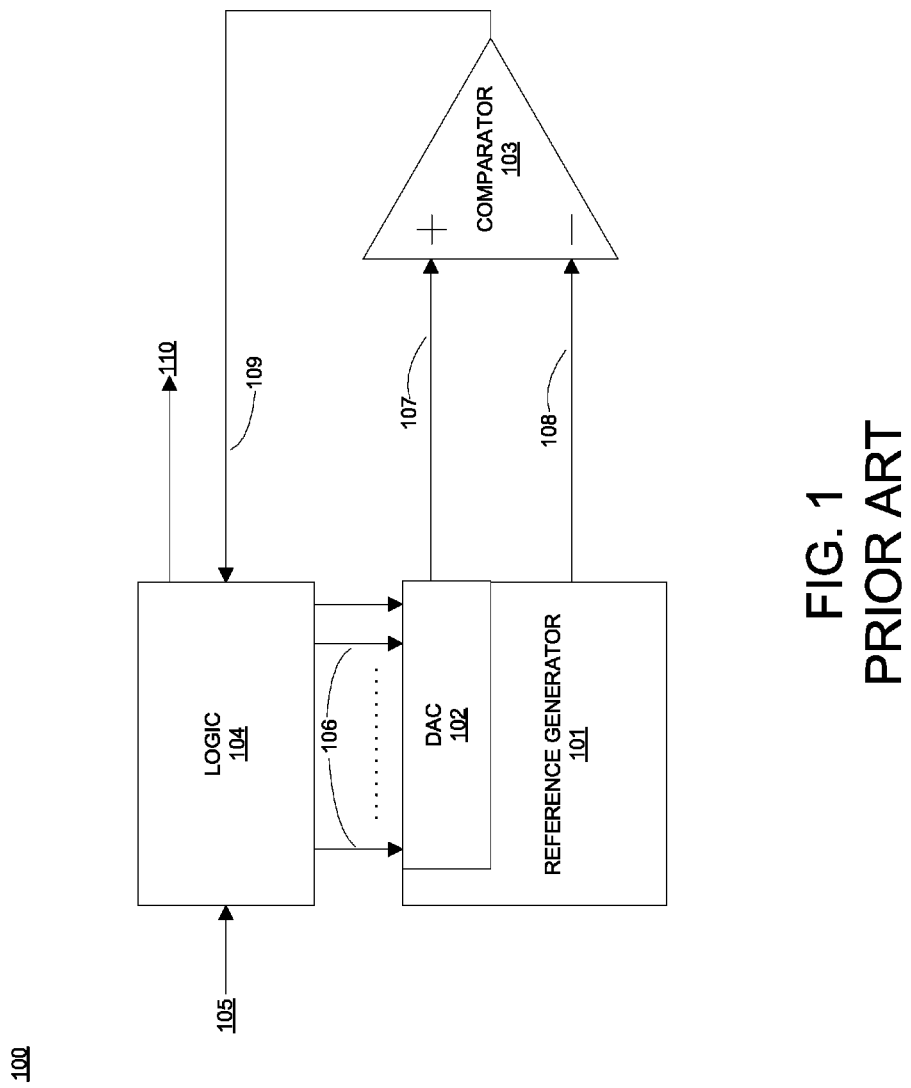
FIG. 1 is a schematic block diagram illustrating an SA-ADC according to the prior art.
Figure 2:
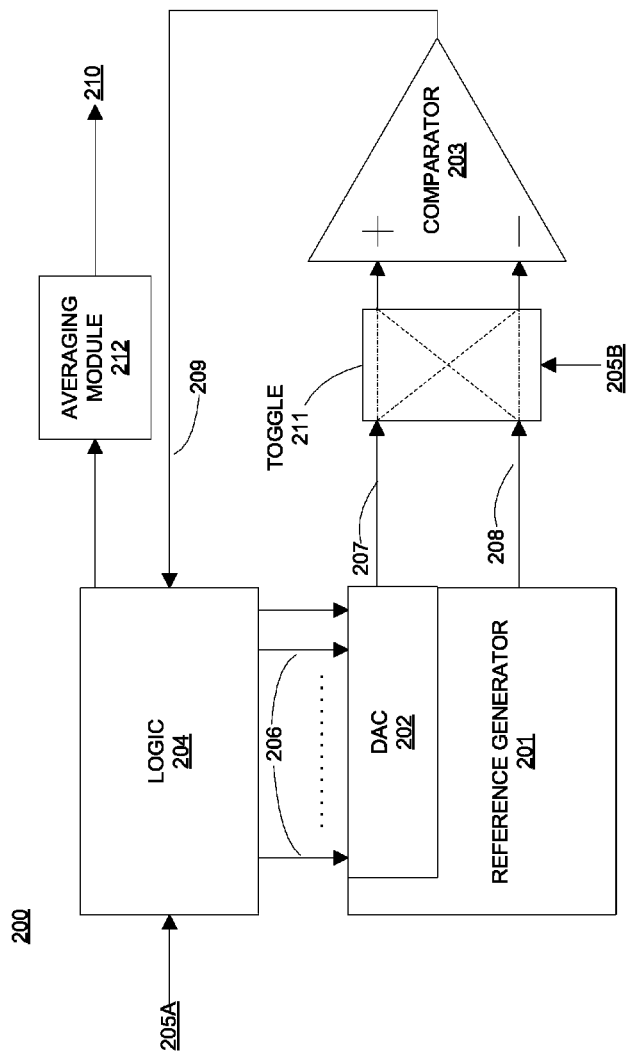
FIG. 2 is a schematic block diagram illustrating an embodiment of an SA-ADC with comparator input toggling.

FIG. 2 shows an embodiment of an SA-ADC 200 with a comparator input toggle 211. SA-ADC 200 includes a reference generator 201 and a DAC 202. In a first state of the comparator input toggle 211, $V_{in}$ 208 may be connected to the negative input of comparator 203, and $V_{guess}$ 207 may be connected to the positive input of comparator 203 (or vice versa in some embodiments). A first result may be determined by logic 204 in the initial toggle state, and then comparator input toggle 211 switches to a second toggle state, in which $V_{in}$ 208 is connected to the positive input of comparator 203, and $V_{guess}$ 207 is connected to the negative input of comparator 203 (or vice versa in some embodiments). A second result is determined in the second toggle state, and the first and second results are averaged by averaging module 212 to cancel out any offset from comparator 203. The averaged result is provided on SA-ADC output 210. Logic clock 205A controls operation of logic 204, while the switching of comparator input toggle 211 is controlled by toggle clock 205B. The toggle clock 205B may run at a divided down frequency compared to the logic clock 205A based on the number of bits (N) in each result. For example, if there are eight bits in the result (i.e., N=8), the logic clock 205A cycles eight times with the toggle clock 205B set in a first position to generate the first result in logic 204, then the logic clock 205A cycles another eight times with the toggle clock 205B in a second position to generate the second result in logic 204.

In operation, the reference generator 201 provides $V_{in}$ 208 to the comparator 203. $V_{in}$ 208 may be, for example, an analog output from an analog sensor in a computer system. The DAC 202 generates $V_{guess}$ 207 based on digital inputs 206 from logic 204, and provides $V_{guess}$ 207 to the comparator 203, and comparator 203 provides signal 209 back to the logic 204. The logic 204 steps through each of N bits in the result set, from the most significant bit to the least significant bit. At each clock cycle of logic clock 205A, the logic 204 determines one more bit of the result set based on the feedback from the comparator 203, and after N clock cycles, a final result set determined. Once the logic 204 determines a result, the result is sent to averaging module 212, and the positive and negative inputs to the comparator 203 are toggled by comparator input toggle 211. The comparator input toggle 211 is configured to toggle $V_{in}$ 208 and $V_{guess}$ 207 every clock cycle of toggle clock 205B (which cycles every N cycles of logic clock 205A), after a result is determined by logic 204. The logic 204 determines a second result with $V_{in}$ 208 and $V_{guess}$ 207 toggled between the positive and negative inputs of the comparator 203. The second result may be determined by initializing the result set to all ones. The logic 204 then sets the most significant bit that in the result set (bit N) to zero, and sends the result to the DAC 202 via digital inputs 206. The DAC generates $V_{guess}$ 207 based on the digital input 206, and provides $V_{guess}$ 207 to the comparator 203. If $V_{guess}$ 207 is indicated to be less than $V_{in}$ 208 by the signal 209 from comparator 203, the most significant bit is set back to one; otherwise, the most significant bit is left as zero. The logic 204 then steps through each bit in the result, from bit N−1 to the least significant bit. The second result is sent from logic 204 to the averaging module 212. The averaging module 212 then determines the average of the first result and the second result and provides the average on the output 210. Because $V_{in}$ 208 and $V_{guess}$ 207 are toggled by comparator input toggle 211, the comparator offset of comparator 203 in the first result and the second result will cancel each other out.

Figure 3:
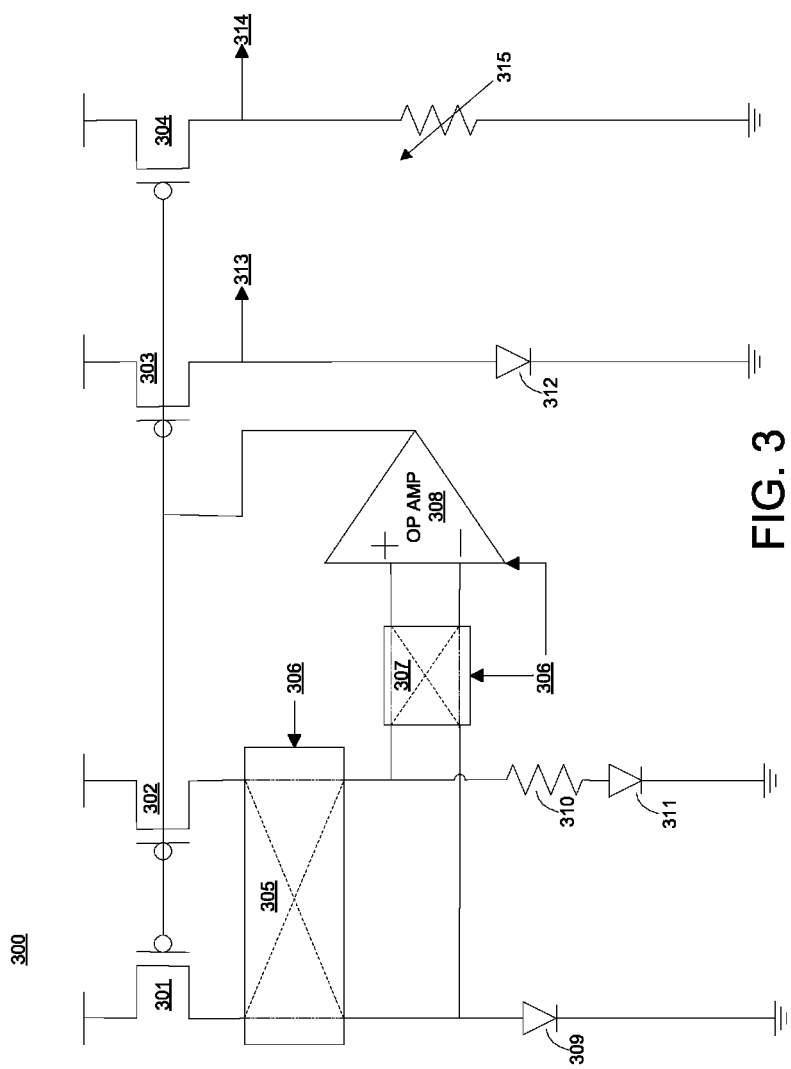
FIG. 3 is a schematic block diagram illustrating an embodiment of a reference generator comprising a current source toggle and an operational amplifier input toggle that may be used conjunction with an SA-ADC with comparator input toggling.

In further embodiments of an SA-ADC such as SA-ADC 200 of FIG. 2, additional toggles may be present inside the reference generator 201, and additional results may be determined corresponding to each combination of toggle positions. Including additional results corresponding to additional toggle positions in the average determined by averaging module 212 provides increased accuracy by compensating for DAC error and/or reference voltage generation error. FIG. 3 illustrates an embodiment of a reference generator 300 that includes current source toggle 305 and operational amplifier input toggle 307. Current source toggle 305 toggles the inputs from current sources connected to p-type field effect transistors (PFETs) 301 and 302 between the ground connection including diode 309 and the ground connection including diode 311 and resistor 310, such that errors in the current sources are cancelled out over successive results. Operational amplifier input toggle 307 toggles the inputs from the current sources connected to PFETs 301 and 302 between the positive and negative inputs of operational amplifier 308, allowing offset from the operational amplifier 307 to be cancelled out over successive results. When operational amplifier input toggle 307 switches the inputs of operational amplifier 308, polarity of operational amplifier 308 is also switched simultaneously. Toggle clock 306 controls toggling of current source toggle 305, and toggling of the operational amplifier input toggle 307 and the polarity switching of operational amplifier 308. Toggle clock 306 may be the same toggle clock 205B of FIG. 2 that controls the comparator input toggle 211. The DAC 202 of FIG. 2 is located inside the reference generator 300 in the form of a tunable resistance 315 that creates $V_{guess}$ 207 at $V_{guess}$ output 314. Tunable resistance 315 is located between PFET 304 and ground. In this embodiment of a reference generator 300, $V_{in}$ 208 is provided at $V_{in}$ output 313. Diode 312 is located between $V_{in}$ output 313 and ground. PFETs 303 and 304 provide current mirroring.

An SA-ADC such as SA-ADC 200 of FIG. 2 may include a reference generator 201 that includes both current source toggle 305 and operational amplifier input toggle 307 in some embodiments; in other embodiments, the reference generator 201 may include one of the current source toggle 305 and operational amplifier input toggle 307, and in still further embodiments, the reference generator 201 may include no toggles. The number of results that are determined by logic 204 and averaged by the averaging module 212 depends on the number of toggles present in the SA-ADC 200. A result is determined and averaged by the SA-ADC 200 for each possible combination of toggle positions. If there is only a comparator input toggle, such as comparator input toggle 211 in FIG. 2, in the SA-ADC 200, two results are determined and averaged. If there is a comparator input toggle and a second toggle (one of current source toggle 305 and operational amplifier input toggle 307) in the reference generator 201, four results are determined and averaged. If there is a comparator input toggle and two toggles (both of current source toggle 305 and operational amplifier input toggle 307) in the reference generator 201, then eight results are determined and averaged. The averaging module 212 includes a memory adder that adds a current result with a total of results determined from previous toggle positions. To determine the final result, the lowest order bits of the adder total are discarded by averaging module 212; the number of discarded bits corresponds to the number of results (and corresponding number of toggle position combinations) being averaged.

Figure 4:
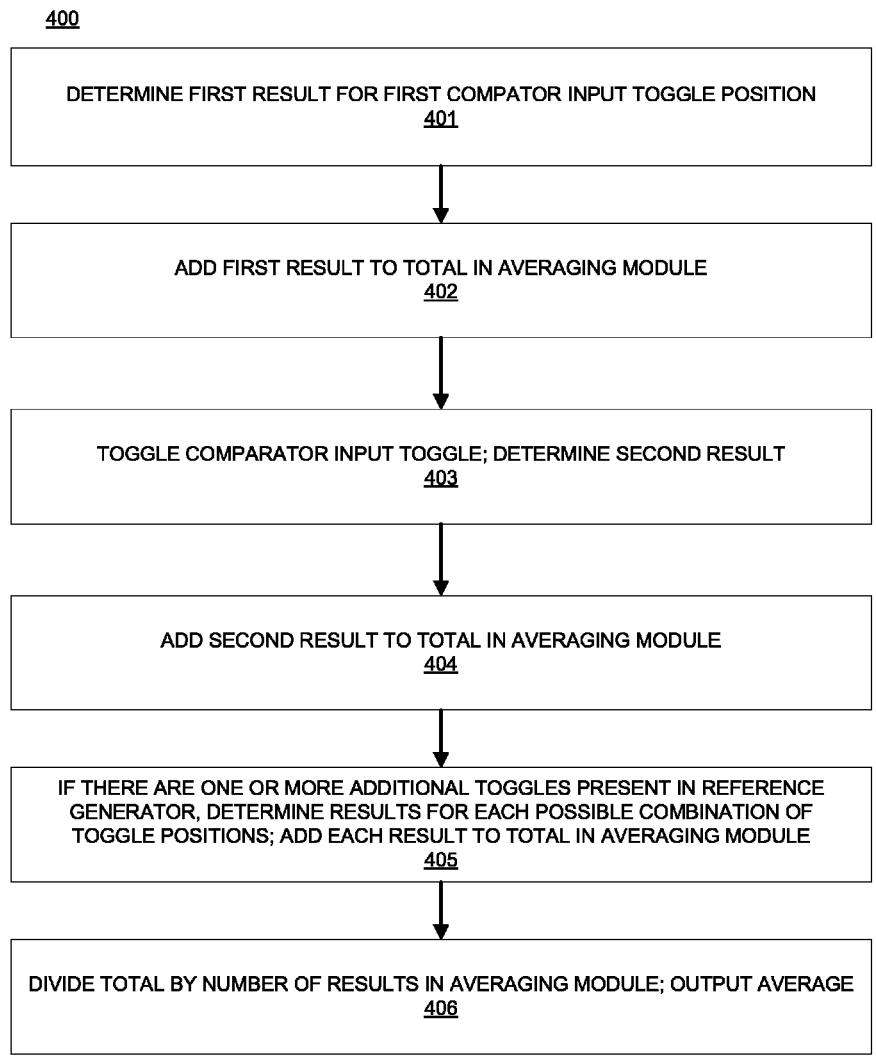
FIG. 4 illustrates an embodiment of a method of operating an SA-ADC with comparator input toggling.

FIG. 4 illustrates an embodiment of a method 400 of operating an SA-ADC such as SA-ADC 200 of FIG. 2. In block 401, a first result is determined by logic 204 with the comparator input toggle 211 in the first position. Then, in block 402, the first result is sent to averaging module 212 and added to a result total. In block 403, the comparator input toggle 211 toggles the inputs of the comparator 203 to second position, and a second result is determined. Then, in block 404, the second result is sent to averaging module 212 and added to the result total. In block 405, averaging module 212 outputs the average of the first result and the second result on output 210. In embodiments of an SA-ADC that include additional toggles in reference generator 201 such as were discussed above with respect to FIG. 3, a result is determined for each possible combination of toggle positions by logic 204 in block 405, and the additional results are also added to the total in averaging module 212. The various toggles may be toggled, and the plurality of results may be determined and added to the total, in any order in various embodiments. Lastly, in block 406, the averaging module 212 divides the total by the number of determined results and outputs the average as the final result.

The technical effects and benefits of exemplary embodiments include increased accuracy in an SA-ADC having relatively small power consumption and footprint.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A successive approximation analog-to-digital converter (SA-ADC), comprising:
   a reference generator configured to output a first voltage and a second voltage, wherein the reference generator comprises a current source input toggle and an operational amplifier input toggle;
   a comparator, the comparator having a positive input and a negative input thereto, the comparator being configured to receive the first voltage and the second voltage; and
   a comparator input toggle located between the reference generator and the comparator, wherein the comparator input toggle is configured to receive the first and second voltages from the reference generator and provide the first and second voltages to the comparator, wherein the comparator input toggle is further configured to switch between a first position, in which the first voltage is connected to the positive input of the comparator, and the second voltage is connected to the negative input of the comparator, and a second position, in which the second voltage is connected to the positive input of the comparator, and the first voltage is connected to the negative input of the comparator.

2. The SA-ADC of claim 1, further comprising logic configured to output a first result corresponding to the first position of the comparator input toggle, and a second result corresponding to the second position of the comparator input toggle.

3. The SA-ADC of claim 2, further comprising an averaging module configured to receive the first result and the second result from the logic, average the first result and the second result, and output the average as a final result of the SA-ADC.

4. The SA-ADC of claim 2, wherein the logic is further configured to control a digital-to-analog converter (DAC) in the reference generator based on input from the comparator, and wherein the DAC is configured to output the first voltage.

5. The SA-ADC of claim 1, wherein the logic is configured to output eight results, and further comprising an averaging module configured to receive the eight results from the logic, average the eight results, and output the average as a final result of the SA-ADC.

6. A method of operating a successive approximation analog-to-digital converter (SA-ADC), the SA-ADC comprising a reference generator configured to output a first voltage and a second voltage, a comparator, the comparator comprising a positive input and a negative input, the comparator being configured to receive the first voltage and the second voltage, and a comparator input toggle, wherein the comparator input toggle is configured to receive the first and second voltages from the reference generator and provide the first and second voltages to the comparator, the method comprising:
   determining a first result corresponding to a first position of the comparator input toggle, in which the first voltage is connected to the positive input of the comparator, and the second voltage is connected to the negative input of the comparator;
   determining a second result corresponding to a second position of the comparator input toggle, in which the second voltage is connected to the positive input of the comparator, and the first voltage is connected to the negative input of the comparator; and
   averaging the first result and the second result and outputting the average as a final result of the SA-ADC;
   wherein the reference generator comprises a current source toggle, wherein the current source toggle is configured to switch between a first position, in which a first current source is connected to a first ground connection comprising a first diode, and a second current source is connected to a second ground connection comprising a second diode and a resistance, and a second position, in which the second voltage is connected to the positive input, in which the first current source is connected to the second ground connection, and the second current source is connected to the first ground connection.

7. The method of claim 6, wherein determining the first result comprises determining a first first result corresponding to the first position of the comparator input toggle and the first position of the current source toggle, and a second first result corresponding to the first position of the comparator input toggle and the second position of the current source toggle;

wherein determining the second result comprises determining a first second result corresponding to the second position of the comparator input toggle and the first position of the current source toggle, and a second second result corresponding to the second position of the comparator input toggle and the second position of the current source toggle; and wherein averaging the first result and the second result comprises averaging the first first result, the first second result, the second first result, and the second second result.

8. A successive approximation analog-to-digital converter (SA-ADC), comprising:

a reference generator configured to output a first voltage and a second voltage, wherein the reference generator comprises an operational amplifier input toggle;

a comparator, the comparator having a positive input and a negative input thereto, the comparator being configured to receive the first voltage and the second voltage; and a comparator input toggle located between the reference generator and the comparator, wherein the comparator input toggle is configured to receive the first and second voltages from the reference generator and provide the first and second voltages to the comparator, wherein the comparator input toggle is further configured to switch between a first position, in which the first voltage is connected to the positive input of the comparator, and the second voltage is connected to the negative input of the comparator, and a second position, in which the second voltage is connected to the positive input of the comparator, and the first voltage is connected to the negative input of the comparator;

wherein the operational amplifier input toggle is configured to switch between a first position, in which a first current input is connected to a positive input of an operational amplifier in the reference generator, and a second current input is connected to a negative input of the operational amplifier, and a second position, in which the second current input is connected to the positive input of the operational amplifier, and the first current input is connected to the negative input of the operational amplifier.

9. The SA-ADC of claim 8, wherein the operational amplifier is configured to switch polarity when the operational amplifier input toggle switches between the first and second positions of the operational amplifier input toggle.

10. The SA-ADC of claim 8, further comprising logic configured to output a first result corresponding to the first position of the comparator input toggle and the first position of the operational amplifier input toggle, a second result corresponding to the first position of the comparator input toggle and the second position of the operational amplifier input toggle, a third result corresponding to the second position of the comparator input toggle and the first position of the operational amplifier input toggle, and a fourth result corresponding to the second position of the comparator input toggle and the second position of the operational amplifier input toggle.

11. The SA-ADC of claim 10, further comprising an averaging module configured to receive the first result, the second result, the third result, and the fourth result from the logic, average the first result, the second result, the third result, and the fourth result, and output the average as a final result of the SA-ADC.

12. A successive approximation analog-to-digital converter (SA-ADC), comprising:

a reference generator configured to output a first voltage and a second voltage wherein the reference generator comprises a current source toggle;

a comparator, the comparator having a positive input and a negative input thereto, the comparator being configured to receive the first voltage and the second voltage; and a comparator input toggle located between the reference generator and the comparator, wherein the comparator input toggle is configured to receive the first and second voltages from the reference generator and provide the first and second voltages to the comparator, wherein the comparator input toggle is further configured to switch between a first position, in which the first voltage is connected to the positive input of the comparator, and the second voltage is connected to the negative input of the comparator, and a second position, in which the second voltage is connected to the positive input of the comparator, and the first voltage is connected to the negative input of the comparator;

wherein the current source toggle is configured to switch between a first position, in which a first current source is connected to a first ground connection comprising a first diode, and a second current source is connected to a second ground connection comprising a second diode and a resistance, and a second position, in which the second voltage is connected to the positive input, in which the first current source is connected to the second ground connection, and the second current source is connected to the first ground connection.

13. The SA-ADC of claim 12, further comprising logic configured to output a first result corresponding to the first position of the comparator input toggle and the first position of the current source toggle, a second result corresponding to the first position of the comparator input toggle and the second position of the current source toggle, a third result corresponding to the second position of the comparator input toggle and the first position of the current source toggle, and a fourth result corresponding to the second position of the comparator input toggle and the second position of the current source toggle.

14. The SA-ADC of claim 13, further comprising an averaging module configured to receive the first result, the second result, the third result, and the fourth result from the logic, average the first result, the second result, the third result, and the fourth result, and output the average as a final result of the SA-ADC.

15. A method of operating a successive approximation analog-to-digital converter (SA-ADC), the SA-ADC comprising a reference generator configured to output a first voltage and a second voltage, a comparator, the comparator comprising a positive input and a negative input, the comparator being configured to receive the first voltage and the second voltage, and a comparator input toggle, wherein the comparator input toggle is configured to receive the first and second voltages from the reference generator and provide the first and second voltages to the comparator, the method comprising:

determining a first result corresponding to a first position of the comparator input toggle, in which the first voltage is connected to the positive input of the comparator, and the second voltage is connected to the negative input of the comparator;

determining a second result corresponding to a second position of the comparator input toggle, in which the second voltage is connected to the positive input of the comparator, and the first voltage is connected to the negative input of the comparator; and averaging the first result and the second result and outputting the average as a final result of the SA-ADC;

wherein the reference generator comprises an operational amplifier input toggle, wherein the operational amplifier input toggle is configured to switch between a first position, in which a first current input is connected to a positive input of an operational amplifier in the reference generator, and a second current input is connected to a negative input of the operational amplifier, and a second position, in which the second current input is connected to the positive input of the operational amplifier, and the first current input is connected to the negative input of the operational amplifier.

16. The method of claim 15, further comprising switching a polarity of the operational amplifier when the operational amplifier input toggle switches between the first and second positions of the operational amplifier input toggle.

17. The method of claim 15, wherein determining the first result comprises determining a first first result corresponding to the first position of the comparator input toggle and the first position of the operational amplifier input toggle, and a second first result corresponding to the first position of the comparator input toggle and the second position of the operational amplifier input toggle;

wherein determining the second result comprises determining a first second result corresponding to the second position of the comparator input toggle and the first position of the operational amplifier input toggle, and a second second result corresponding to the second position of the comparator input toggle and the second position of the operational amplifier input toggle; and wherein averaging the first result and the second result comprises averaging the first first result, the first second result, the second first result, and the second second result.

18. A method of operating a successive approximation analog-to-digital converter (SA-ADC), the SA-ADC comprising a reference generator configured to output a first voltage and a second voltage, a comparator, the comparator comprising a positive input and a negative input, the comparator being configured to receive the first voltage and the second voltage, and a comparator input toggle, wherein the comparator input toggle is configured to receive the first and second voltages from the reference generator and provide the first and second voltages to the comparator, the method comprising:

determining a first result corresponding to a first position of the comparator input toggle, in which the first voltage is connected to the positive input of the comparator, and the second voltage is connected to the negative input of the comparator;

determining a second result corresponding to a second position of the comparator input toggle, in which the second voltage is connected to the positive input of the comparator, and the first voltage is connected to the negative input of the comparator; and averaging the first result and the second result and outputting the average as a final result of the SA-ADC;

wherein the reference generator comprises a current source input toggle and an operational amplifier input toggle, and further comprising determining eight results, each of the eight results corresponding to a respective combination of toggle positions of the comparator input toggle, the current source input toggle, and the operational amplifier input toggle, and further comprising averaging the eight results, and outputting the average as a final result of the SA-ADC.

* * * * *